(12) United States Patent
Wang

(10) Patent No.: US 10,558,090 B2
(45) Date of Patent: Feb. 11, 2020

(54) LIQUID CRYSTAL DISPLAY PANEL AND MANUFACTURING METHOD THEREOF

(71) Applicant: SHENZHEN CHINA STAR OPTOELECTRONICS TECHNOLOGY CO., LTD., Guangdong (CN)

(72) Inventor: Zui Wang, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 136 days.

(21) Appl. No.: 15/577,357

(22) PCT Filed: Nov. 22, 2017

(86) PCT No.: PCT/CN2017/112402
§ 371 (c)(1),
(2) Date: Nov. 28, 2017

(87) PCT Pub. No.: WO2019/085067
PCT Pub. Date: May 9, 2019

(65) Prior Publication Data
US 2019/0129220 A1    May 2, 2019

(30) Foreign Application Priority Data

Oct. 30, 2017    (CN) .......................... 2017 1 1051972

(51) Int. Cl.
*G02F 1/1339*    (2006.01)

(52) U.S. Cl.
CPC ........ *G02F 1/13394* (2013.01); *G02F 1/1339* (2013.01)

(58) Field of Classification Search
CPC ............... G02F 1/13394; G02F 1/1339; G02F 1/133514
See application file for complete search history.

(56) References Cited

U.S. PATENT DOCUMENTS

| 2009/0141205 A1 | 6/2009 | Park |
| 2011/0090445 A1 | 4/2011 | Kim |
| 2012/0154732 A1 | 6/2012 | Morita |

FOREIGN PATENT DOCUMENTS

| CN | 1727975 A | 2/2006 |
| CN | 102043297 A | 5/2011 |
| CN | 102830562 A | 12/2012 |

*Primary Examiner* — Thanh Nhan P Nguyen
(74) *Attorney, Agent, or Firm* — Mark M. Friedman

(57) ABSTRACT

A liquid crystal display panel is provided and has a color filter substrate and an array substrate. The array substrate has a sealant coating region. A first metal wire is disposed on the sealant coating region. An insulating layer is disposed on the sealant coating region and is located above the first metal wire. A second metal wire is disposed on the sealant coating region and is located above the insulating layer. Via holes are defined in the insulating layer in the sealant coating region. The second metal wire is connected to the first metal wire through the via holes. A redundant spacer is formed on the sealant coating region and correspondingly covers the via holes.

13 Claims, 5 Drawing Sheets

LIQUID CRYSTAL DISPLAY PANEL AND MANUFACTURING METHOD THEREOF

FIELD OF INVENTION

The present invention relates to fields of liquid crystal displaying technologies, especially to a liquid crystal display panel and a manufacturing method thereof.

BACKGROUND OF INVENTION

Recently, liquid crystal display panels generally employ gate driver on array (GOA) designs that are various combinations of thin film transistor (TFT) circuits on an array substrate to realize scan line functions, and to substitute for gate electrode driver chips such that lowered cost objectives can be achieved. Functional signal lines connect to GOA lines at all levels through via holes to control transmission of scan signals.

In narrow edge frame products, sealants are always required to be designed on functional signal lines. However, in operation environments having high temperatures and high humidity, because alignment liquid and sealant absorb water vapor, water vapor erodes via holes in the functional signal lines, resulting in short circuit of the via holes, which further causes malfunction of the display panel.

As described above, the conventional liquid crystal display panel has the following issue. Because a sealant disposed in a region close to an edge of an array substrate covers some of via holes for realizing connection between functional signal lines and gate driver on array (GOA) lines, the sealant absorbs water vapor to result in erosion of the contacted via holes to further influence displaying.

SUMMARY OF THE INVENTION

The present invention provides a liquid crystal display panel that is able to protect via holes in a sealant coating region from suffering erosion by water vapor and resulting in short circuit to solve the technical issues of a conventional liquid crystal display panel that because a sealant disposed in a sealant coating region on an edge of an array substrate covers some of via holes for realizing connection between functional signal lines and gate driver on array (GOA) lines, the sealant easily absorbs water vapor to result in erosion of the via holes to further influence displaying.

To solve the abovementioned issues, the present invention provides technological solutions as follows.

The present invention provides a liquid crystal display panel comprising:

a color filter substrate;

an array substrate disposed opposite to the color filter substrate;

the array substrate comprising:

a sealant coating region located on an outside region around a displaying region of the liquid crystal display panel with a sealant coated on the outside region, the sealant coating region comprising a first metal wire disposed therein, an insulating layer disposed on the first metal wire, and a second metal wire disposed on the insulating layer, the insulating layer in the sealant coating region having via holes defined therein, and the second metal wire connected to the first metal wire through the via holes;

a redundant spacer formed in the sealant coating region and correspondingly covering the via holes; and the sealant of the sealant coating region coated on a surface of the redundant spacer.

According to a preferred embodiment of the present invention, the redundant spacer correspondingly covers at least two of the via holes.

According to a preferred embodiment of the present invention, the redundant spacer is rectangular, and at least two bar-like recess portions are formed on a surface of the redundant spacer.

According to a preferred embodiment of the present invention, the bar-like recess portions are parallel to long sides of the redundant spacer.

According to a preferred embodiment of the present invention, the bar-like recess portions are parallel to short sides of the redundant spacer.

According to a preferred embodiment of the present invention, primary spacers are disposed in the displaying region and are configured to form an interval between the color filter substrate and the array substrate, and the primary spacer and the redundant spacer are simultaneously made of a same material.

According to a preferred embodiment of the present invention, the primary spacer and the redundant spacer are both made of a photoresist material.

According to a preferred embodiment of the present invention, a height of a surface of the redundant spacer is lower than a height of a surface of the primary spacer.

The present invention also provides a liquid crystal display panel comprising:

a color filter substrate;

an array substrate disposed opposite to the color filter substrate;

the array substrate comprising:

a sealant coating region located on an outside region around a displaying region of the liquid crystal display panel with a sealant coated on the outside region, the sealant coating region comprising a first metal wire disposed therein, an insulating layer disposed on the first metal wire, and a second metal wire disposed on the insulating layer, the insulating layer in the sealant coating region having via holes defined therein, and the second metal wire connected to the first metal wire through the via holes; and a redundant spacer formed in the sealant coating region and correspondingly covering the via holes.

According to a preferred embodiment of the present invention, the redundant spacer correspondingly covers at least two of the via holes.

According to a preferred embodiment of the present invention, the redundant spacer is rectangular, and at least two bar-like recess portions are formed on a surface of the redundant spacer.

According to a preferred embodiment of the present invention, the bar-like recess portions are parallel to long sides of the redundant spacer.

According to a preferred embodiment of the present invention, the bar-like recess portions are parallel to short sides of the redundant spacer.

According to a preferred embodiment of the present invention, primary spacers are disposed in the displaying region and are configured to form an interval between the color filter substrate and the array substrate, and the primary spacer and the redundant spacer are simultaneously made of a same material.

According to a preferred embodiment of the present invention, the primary spacer and the redundant spacer are both made of a photoresist material.

According to a preferred embodiment of the present invention, a height of a surface of the redundant spacer is lower than a height of a surface of the primary spacer.

According to the aforementioned objective of the present invention, a liquid crystal display panel manufacturing method is provided, the liquid crystal display panel manufacturing method comprises:

step S10, providing array substrate, wherein a pixel region is defined on a surface of the array substrate, and a sealant coating region is defined on the surface of the array substrate and is located on an outside region of the pixel region;

step S20, disposing a first metal wire in the sealant coating region;

step S30, disposing an insulating layer in the sealant coating region, and defining via holes in the insulating layer, wherein the insulating layer covers the first metal wire;

step S40, disposing a second metal wire on the insulating layer, and connecting the second metal wire to the first metal wire through the via holes;

step S50, disposing a redundant spacer on surfaces of the via holes;

step S60, disposing a sealant on a surface of the redundant spacer; and step S70, providing a color filter substrate, disposing the color filter substrate opposite to the array substrate, and adhering the color filter substrate and the array substrate together through the sealant.

Advantageous effects of the present invention are as follows. In comparison a conventional liquid crystal display panel, the liquid crystal display panel provided by the present invention, by setting a spacer layer between a surface of a sealant coating region and via holes, protects the via holes from suffering erosion from water vapor and ensures the via holes to realize normal connection functions of lines. The liquid crystal display panel provided by the present invention solves the technical issue of the conventional liquid crystal display panel that because a sealant disposed in a region close to an edge of an array substrate covers some of via holes for realizing connection between functional signal lines and gate driver on array (GOA) lines, the sealant absorbs water vapor to result in erosion of the contacted via holes to further influence displaying.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
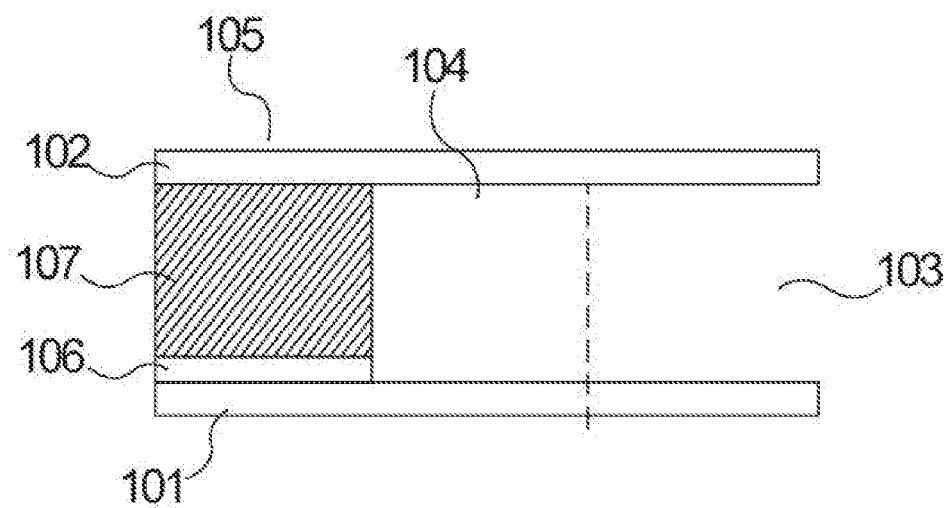
FIG. 1 is a schematic structural view of a liquid crystal display panel in accordance with the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

The present invention is aimed at the technical issue of a conventional liquid crystal display panel that because a sealant disposed in a sealant coating region of an array substrate covers some of via holes for realizing connection between functional signal lines and gate driver on array (GOA) lines, the sealant absorbs water vapor to result in erosion of the contacted via holes to further influence displaying. The present embodiment may solve the above defects.

With reference to FIG. 1, a liquid crystal display panel provided by the present invention includes an array substrate 101, wherein a pixel region 103 is defined on a surface of the array substrate 101, and the pixel region 103 corresponds to a displaying region of the liquid crystal display panel; a GOA circuit region 104, disposed on an outside of the pixel region 103; a sealant coating region 105 located on an outside region of the GOA circuit region 104; a redundant spacer 106 disposed in the sealant coating region 105, a sealant 107 coated on a surface of the redundant spacer 106, a color filter substrate 102 disposed opposite to the array substrate 101, and the color filter substrate 102 and the array substrate 101 adhered together by the sealant 107.

Figure 2:
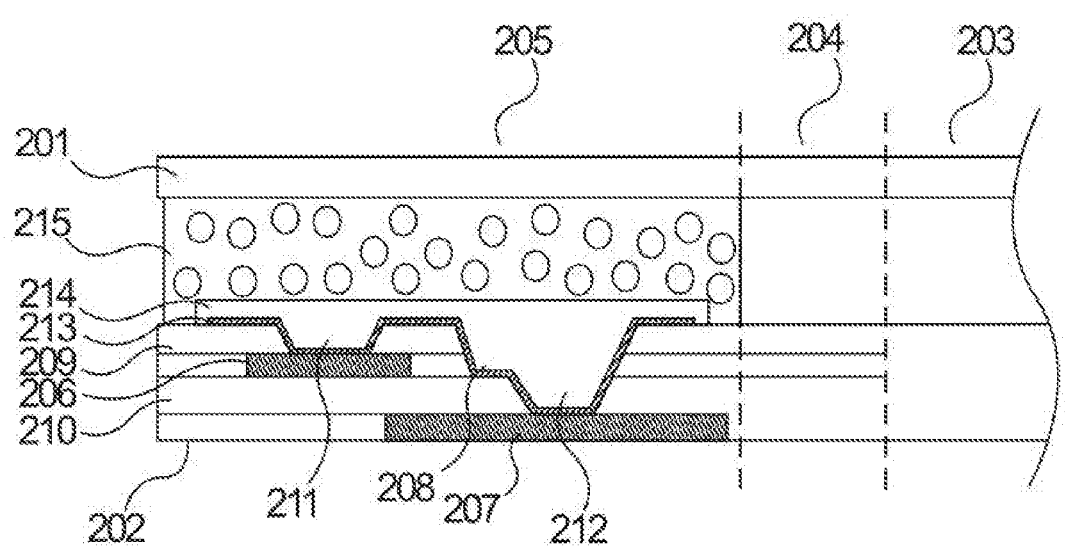
FIG. 2 is a schematic cross-sectional view of the liquid crystal display panel in accordance with the present invention.

With reference to FIG. 2, the liquid crystal display panel provided by the present invention includes a color filter substrate 201 and an array substrate 202 disposed opposite to the color filter substrate 201. Primary spacers are disposed between the color filter substrate 201 and the array substrate 202 and are arranged in an array. The primary spacers space the array substrate 202 from the color filter substrate 201 to form a constant interval. A liquid crystal layer is disposed in the interval between the array substrate 202 and the color filter substrate 201.

A pixel region 203, a GOA circuit region 204 and a sealant coating region 205 are defined on a surface of the array substrate 202.

Multiple thin film transistors are disposed in the pixel region 203 and are arranged in an array, and each of the thin film transistors includes a gate electrode, a source electrode and a drain electrode. The first region further includes multiple data lines and multiple scan lines, one of the scan lines perpendicularly intersects one of the data lines to form a pixel unit. Pixel electrodes are formed respectively in the pixel units. Each of the thin film transistors is disposed in each of the pixel units. Each of the scan lines is connected to the gate electrodes of the thin film transistors in a same column. Each of the data lines is connected to the source electrodes of the thin film transistors in a same row. Each of the pixel electrodes is connected to the drain electrode of a corresponding one of the thin film transistors.

A first metal wire 206 is disposed in the sealant coating region 205. An insulating layer is disposed in the sealant coating region 205 and covers the first sealant coating region 205 and the first metal wire 206. A second metal wire 207 is disposed in the sealant coating region 205 and is disposed on a surface of the insulating layer. Via holes 208 are formed in the insulating layer, and the first metal wire 206 is connected to the second metal wire 207 through the via holes 208. The first metal wire 206 is a metal jumper line. An input terminal of the first metal wire 206 is connected to the second metal wire 207. The second metal wire 207 functionally serves as a wire, for example, a clock signal circuit, a power circuit, etc.

A GOA wire is disposed in the GOA circuit region 204, and an output terminal of the first metal wire 206 is connected to the GOA wire.

The first metal wire 206 and the second metal wire 207 are disposed in different film layers of the array substrate 202. A first insulating layer 209 is disposed on an upper surface of the first metal wire 206. A second insulating layer 210 is disposed between the second metal wire 207 and the first metal wire 206. The first metal wire 206 is connected to the second metal wire 207 through the via holes 208. The via holes 208 include a first hole 211 defined through the first insulating layer 209 for exposing the first metal wire 206, and a second hole 212 defined through the second insulating layer 210 for exposing the second metal wire 207. A transparent metal layer 213 is disposed on a surface of the first hole 211 and a surface of the second hole 212 for conduction of the first metal wire 206 and the second metal wire 207.

A redundant spacer 214 is also disposed in the sealant coating region 205. The redundant spacer 214 covers the surface of corresponding ones of the via holes 208 to isolate the sealant 215 from the via hole 208 on a bottom of the sealant 215 to prevent the sealant 215 from absorbing water vapor to cause the water to invade and erode the metal layer under high temperature environment.

A shape of the redundant spacer 214 is similar to a rectangle. The redundant spacer 214 correspondingly covers at least two of the via holes 208.

Because the redundant spacer 214 has a certain thickness, to ensure the uniformity of a thickness of an interval between the array substrate 202 and the color filter substrate 201, a thickness of the sealant 215 should be reduced. However, there is a risk of the thinner sealant 215 having a poorer adhering ability and easily falling off. Therefore, a thickness of the redundant spacer 214 is set to have a height of a surface of the redundant spacer 214 to be lower than a height of a surface of the primary spacer such that the aforementioned risk.

The redundant spacer 214 and the primary spacer are both made of a photoresist material such that the redundant spacer 214 and the primary spacer may be simultaneously made on the array substrate 202 to reduce processes. To make thickness of the redundant spacer 214 as less as possible, a mask corresponding to the redundant spacer 214 employs a half-tone mask, and slits are formed in a surface of the mask. The redundant spacer 214 employs a negative photosensitive material. The part of the negative photosensitive material irradiated by light would not be dissolved in the photoresist developer solution, and the part of the negative photosensitive material kept from irradiation of light would be dissolved in photoresist developer solution.

The redundant spacer 214 formed by using the half-tone mask defined with the slits has at least two bar-like recess portions formed in the surface of the redundant spacer 214. The bar-like recess portions are configured to hold the sealant 215 coated on the surface of the redundant spacer 214 to reduce fluidity of the sealant 215. For example, the bar-like recess portions are parallel to long sides of the redundant spacer 214. Alternatively, the bar-like recess portions are parallel to short sides of the redundant spacer 214.

Figure 3:
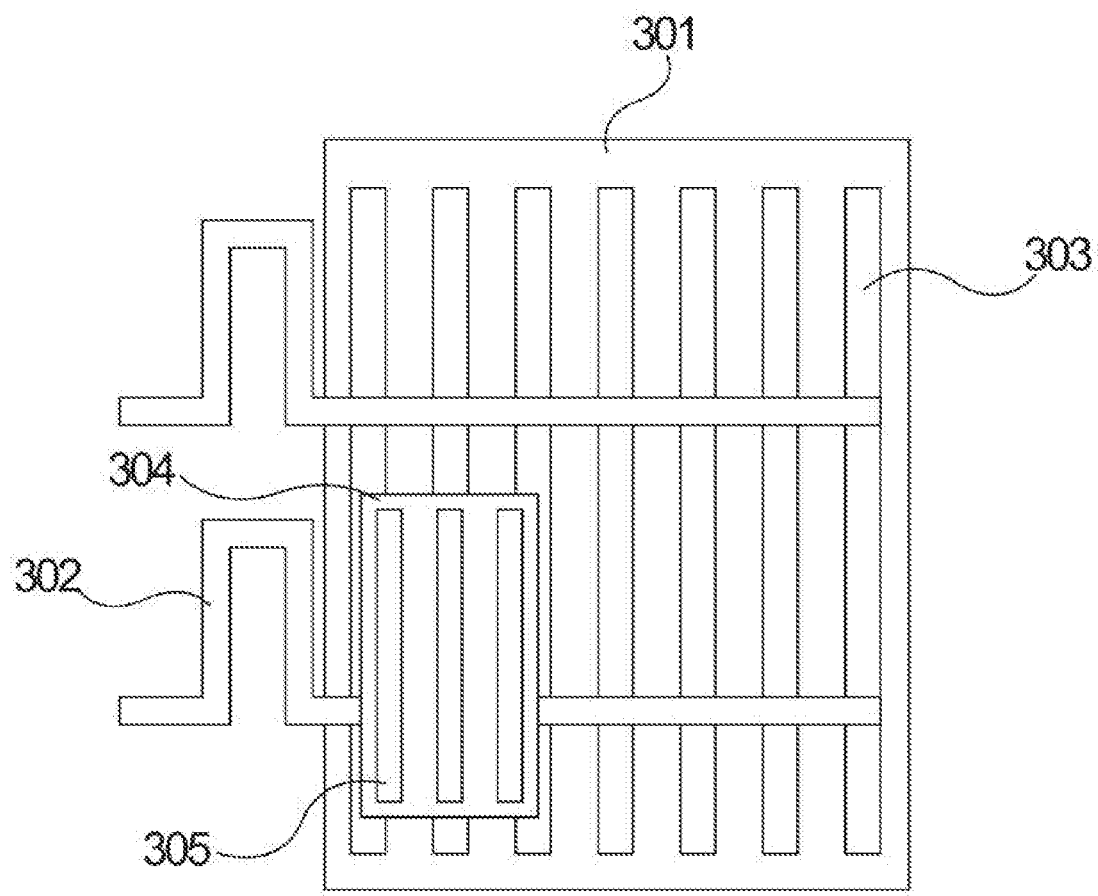
FIG. 3 is a schematic front view of the liquid crystal display panel in accordance with the present invention.

With reference to FIG. 3, a sealant coating region 301 of the liquid crystal display panel provided by the present invention includes a first metal wire 302, a second metal wire 303 and a redundant spacer 304.

An insulating layer is disposed between the first metal wire 302 and the second metal wire 303. Via holes are formed in the insulating layer. The first metal wire 302 is connected to the second metal wire 303 through the via holes. An input terminal of the first metal wire 302 is connected to the second metal wire 303, and an output terminal of the first metal wire 302 is connected to a GOA wire.

The redundant spacer 304 cover the via holes.

Bar-like recess portions 305 are formed in the redundant spacer 304, and the bar-like recess portion 305 are parallel to long sides of the redundant spacer 304.

Figure 4:
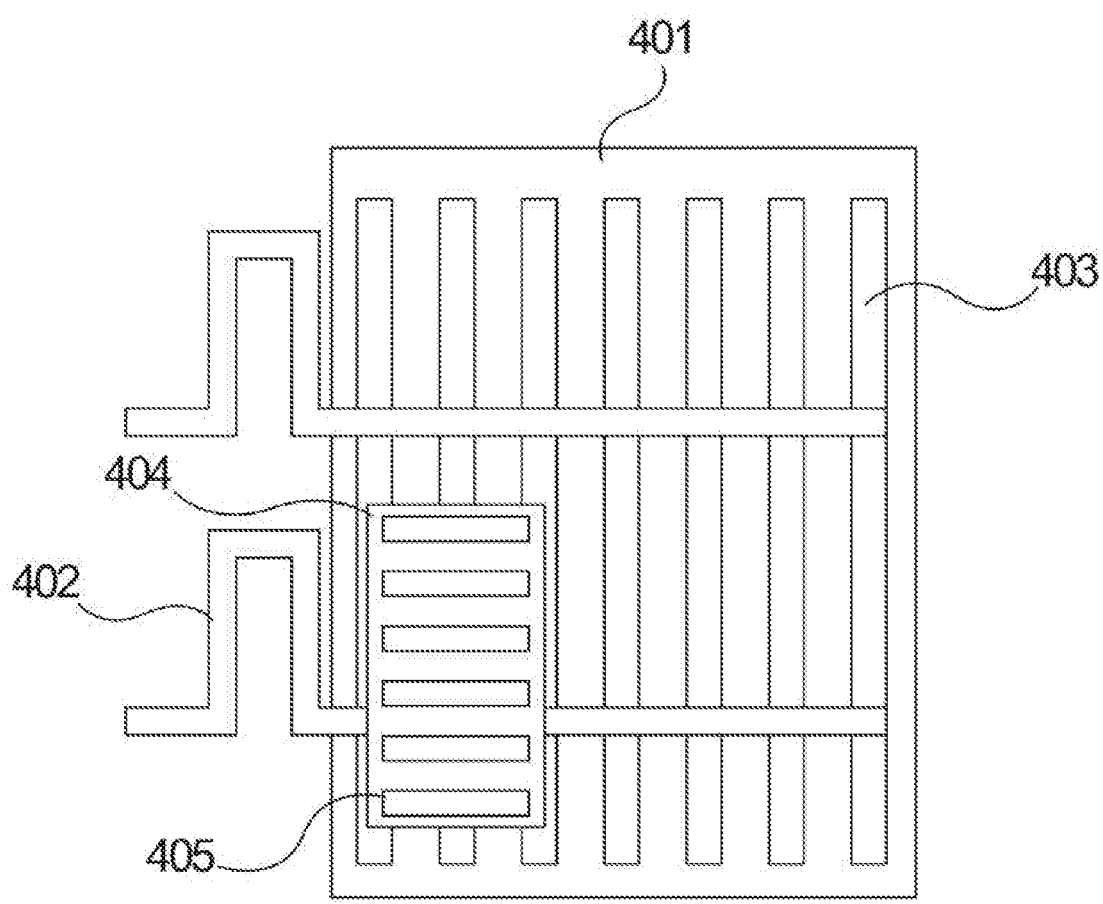
FIG. 4 is another schematic front view of the liquid crystal display panel in accordance with the present invention.

With reference to FIG. 4, a sealant coating region 401 of a liquid crystal display panel provided by the present invention includes a first metal wire 402, a second metal wire 403 and a redundant spacer 404.

The difference of the above liquid crystal display panel from the liquid crystal display panel as shown in FIG. 3 lies in that bar-like recess portions 405 of the surface of the redundant spacer 404 are parallel to short sides of the redundant spacer 404.

Figure 5:
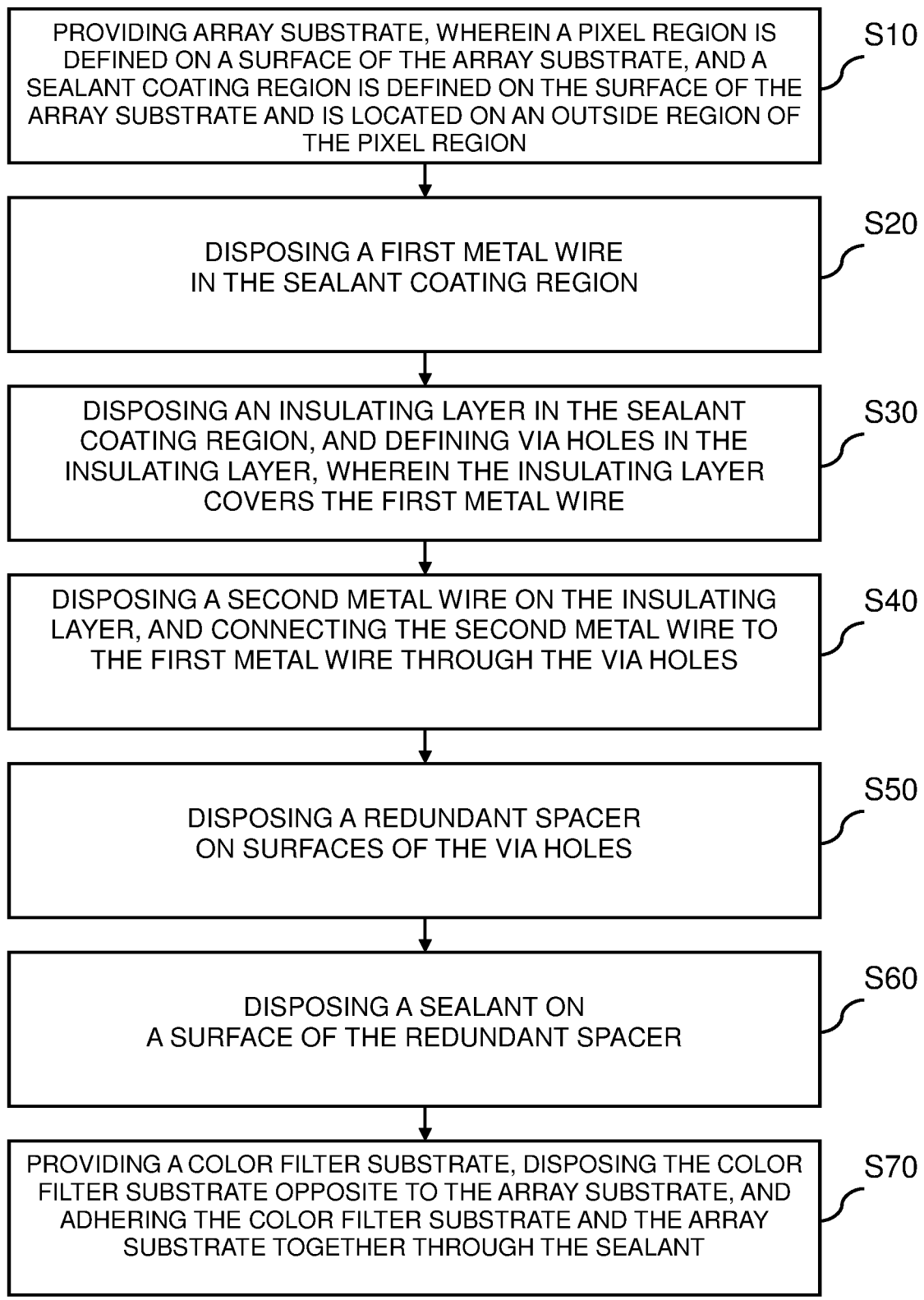
FIG. 5 is a flowchart of a liquid crystal display panel manufacturing method in accordance with the present invention.

With reference to FIG. 5, according to the above objective of the present invention, a liquid crystal display panel manufacturing method is provided and includes:

step S10, providing array substrate, wherein a pixel region is defined on a surface of the array substrate, and a sealant coating region is defined on the surface of the array substrate and is located on an outside region of the pixel region;

step S20, disposing a first metal wire in the sealant coating region;

step S30, disposing an insulating layer in the sealant coating region, and defining via holes in the insulating layer, wherein the insulating layer covers the first metal wire;

step S40, disposing a second metal wire on the insulating layer, and connecting the second metal wire to the first metal wire through the via holes;

step S50, disposing a redundant spacer on surfaces of the via holes;

step S60, disposing a sealant on a surface of the redundant spacer; and step S70, providing a color filter substrate, disposing the color filter substrate opposite to the array substrate, and adhering the color filter substrate and the array substrate together through the sealant.

Advantageous effects of the present invention are as follows. In comparison to conventional liquid crystal display panel, the liquid crystal display panel provided by the present invention, by setting a spacer layer between a surface of a sealant coating region and via holes, protects the via holes from suffering erosion from water vapor and ensures the via holes to realize normal connection functions of lines. The liquid crystal display panel provided by the present invention solves conventional liquid crystal display panel technical issue in that because a sealant disposed in a region close to an edge of an array substrate covers some of via holes to realize connection between functional signal lines and gate driver on array (GOA) lines, the sealant absorbs water vapor that would result in erosion of the contacted via holes that further influences display.

Although preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

What is claimed is:

1. A liquid crystal display panel, comprising:
   a color filter substrate;
   an array substrate disposed opposite to the color filter substrate;
   the array substrate comprising:
      a sealant coating region located on an outside region around a displaying region of the liquid crystal display panel with a sealant coated on the outside region, the sealant coating region comprising a first metal wire disposed therein, an insulating layer disposed on the first metal wire, and a second metal wire disposed on the insulating layer, the insulating layer in the sealant coating region having via holes defined therein, and the second metal wire connected to the first metal wire through the via holes;
      a redundant spacer formed in the sealant coating region and covering the via holes; and
      the sealant of the sealant coating region coated on a surface of the redundant spacer;
   wherein the redundant spacer covers at least two of the via holes;
   wherein the redundant spacer is rectangular, and at least two bar-like recess portions are formed on a surface of the redundant spacer.

2. The liquid crystal display panel as claimed in claim 1, wherein the bar-like recess portions are parallel to long sides of the redundant spacer.

3. The liquid crystal display panel as claimed in claim 1, wherein the bar-like recess portions are parallel to short sides of the redundant spacer.

4. The liquid crystal display panel as claimed in claim 1, wherein primary spacers are disposed in the displaying region and are configured to form an interval between the color filter substrate and the array substrate, and the primary spacer and the redundant spacer are simultaneously made of a same material.

5. The liquid crystal display panel as claimed in claim 4, wherein the primary spacer and the redundant spacer are both made of a photoresist material.

6. The liquid crystal display panel as claimed in claim 4, wherein a height of a surface of the redundant spacer is lower than a height of a surface of the primary spacer.

7. A liquid crystal display panel, comprising:
   a color filter substrate;
   an array substrate disposed opposite to the color filter substrate;
   the array substrate comprising:
      a sealant coating region located on an outside region around a displaying region of the liquid crystal display panel with a sealant coated on the outside region, the sealant coating region comprising a first metal wire disposed therein, an insulating layer disposed on the first metal wire, and a second metal wire disposed on the insulating layer, the insulating layer in the sealant coating region having via holes defined therein, and the second metal wire connected to the first metal wire through the via holes; and
      a redundant spacer formed in the sealant coating region and covering the via holes;
   wherein the redundant spacer covers at least two of the via holes;
   wherein the redundant spacer is rectangular, and at least two bar-like recess portions are formed on a surface of the redundant spacer.

8. The liquid crystal display panel as claimed in claim 7, wherein the bar-like recess portions are parallel to long sides of the redundant spacer.

9. The liquid crystal display panel as claimed in claim 7, wherein the bar-like recess portions are parallel to short sides of the redundant spacer.

10. The liquid crystal display panel as claimed in claim 7, wherein primary spacers are disposed in the displaying region and are configured to form an interval between the color filter substrate and the array substrate, and the primary spacer and the redundant spacer are simultaneously made of a same material.

11. The liquid crystal display panel as claimed in claim 10, wherein the primary spacer and the redundant spacer are both made of a photoresist material.

12. The liquid crystal display panel as claimed in claim 10, wherein a height of a surface of the redundant spacer is lower than a height of a surface of the primary spacer.

13. A liquid crystal display panel manufacturing method, comprising:
   step S10, providing array substrate, wherein a pixel region is defined on a surface of the array substrate, and a sealant coating region is defined on the surface of the array substrate and is located on an outside region of the pixel region;
   step S20, disposing a first metal wire in the sealant coating region;
   step S30, disposing an insulating layer in the sealant coating region, and defining via holes in the insulating layer, wherein the insulating layer covers the first metal wire;
   step S40, disposing a second metal wire on the insulating layer, and connecting the second metal wire to the first metal wire through the via holes;
   step S50, disposing a redundant spacer on surfaces of the via holes;
   step S60, disposing a sealant on a surface of the redundant spacer; and
   step S70, providing a color filter substrate, disposing the color filter substrate opposite to the array substrate, and adhering the color filter substrate and the array substrate together through the sealant;
   wherein the redundant spacer covers at least two of the via holes;
   wherein the redundant spacer is rectangular, and at least two bar-like recess portions are formed on a surface of the redundant spacer.

* * * * *